United States Patent [19]

Frei et al.

[11] Patent Number: 5,342,999
[45] Date of Patent: Aug. 30, 1994

[54] APPARATUS FOR ADAPTING SEMICONDUCTOR DIE PADS AND METHOD THEREFOR

[75] Inventors: John K. Frei; Kenneth Brice-Heames, both of Mesa, Ariz.

[73] Assignee: Motorola, Inc., Schaumburg, Ill.

[21] Appl. No.: 994,380

[22] Filed: Dec. 21, 1992

[51] Int. Cl.⁵ .................................................. H05K 1/09
[52] U.S. Cl. .................................. 174/266; 174/262; 174/260; 361/767
[58] Field of Search ............. 174/261, 262, 263, 253, 174/266, 250, 260; 361/400, 403, 767

[56] References Cited

U.S. PATENT DOCUMENTS

| | | | |
|---|---|---|---|
| 4,202,007 | 5/1980 | Dougherty et al. | 174/260 X |
| 4,245,273 | 1/1981 | Feinberg et al. | 361/382 |
| 4,254,445 | 3/1981 | Ho | 361/392 |
| 4,521,449 | 6/1985 | Arnold et al. | 427/96 |
| 4,551,788 | 11/1985 | Daniel et al. | 361/403 |
| 4,598,167 | 7/1986 | Ushifusa et al. | 174/262 X |
| 4,729,061 | 3/1988 | Brown | 174/266 |
| 4,858,819 | 8/1989 | Hill et al. | 228/179 |
| 4,914,259 | 4/1990 | Kobayashi et al. | 361/403 X |
| 5,091,825 | 2/1992 | Hill et al. | 361/404 |
| 5,120,678 | 6/1992 | Moore et al. | 437/183 |
| 5,122,929 | 6/1992 | Palanisamy et al. | 361/400 |
| 5,177,670 | 1/1993 | Shinohara et al. | 174/253 X |
| 5,239,448 | 8/1993 | Perkins et al. | 174/266 X |

FOREIGN PATENT DOCUMENTS 484756  5/1992  European Pat. Off. ............ 174/260

*Primary Examiner*—Leo P. Picard
*Assistant Examiner*—L. Thomas
*Attorney, Agent, or Firm*—Robert M. Handy

[57] ABSTRACT

A carrier allows a semiconductor die to be flip-chip mounted to a printed wiring board. Many carriers are formed together in an array. A bottom pad constellation formed on one side of a carrier is compatible with the printed wiring board's layout rules. This pad constellation couples to a top pad constellation on the opposing side of the carrier through stepped vias. Conductive bumps made from an alloy of gold and a metal from the platinum family are formed on bond-pads of the die. The top pad constellation of the carrier is formed primarily from gold. The carrier's bottom pad constellation is formed from the gold/platinum alloy. Carriers and dice may be tested by probing the carrier's pad bottom constellation. After testing, solder bumps are formed on the bottom pad constellation, and the carrier is soldered to the printed wiring board.

9 Claims, 7 Drawing Sheets

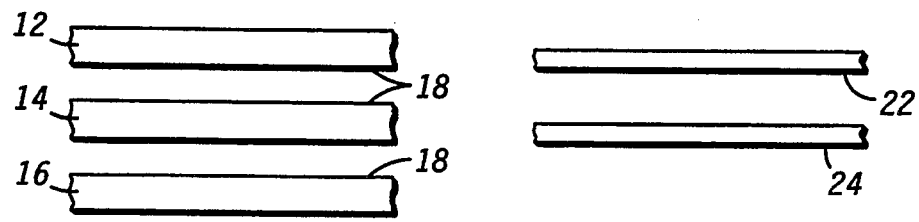
FIG. 1
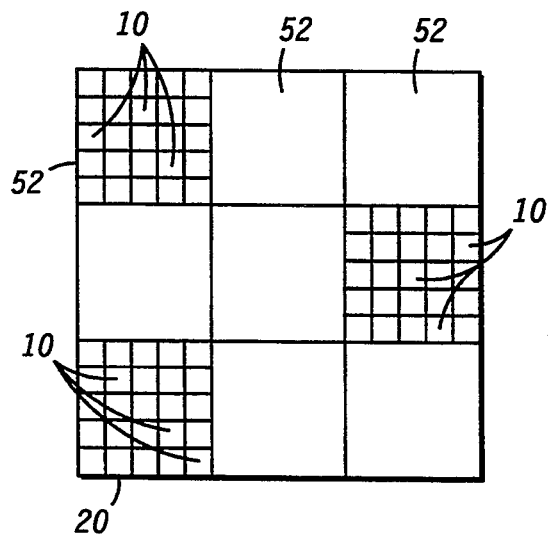
FIG. 2
FIG. 3
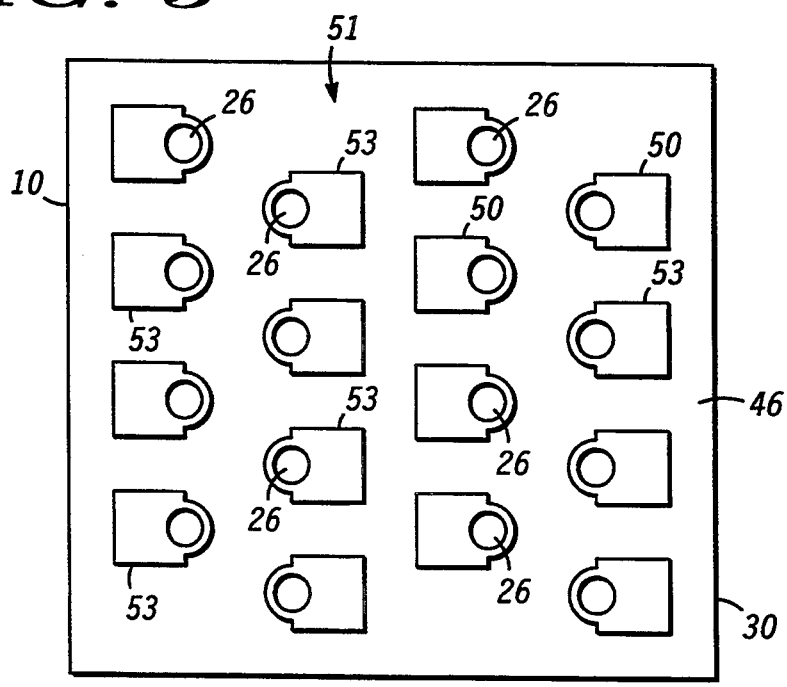

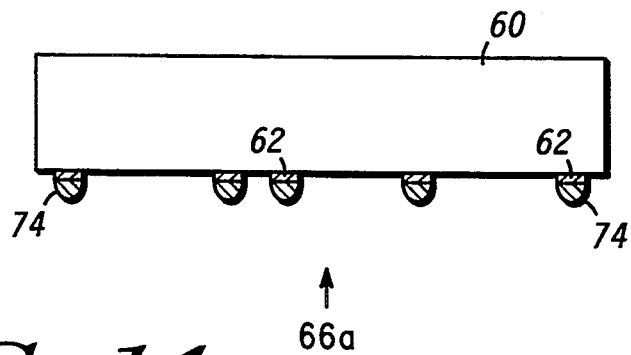
FIG. 14
FIG. 15
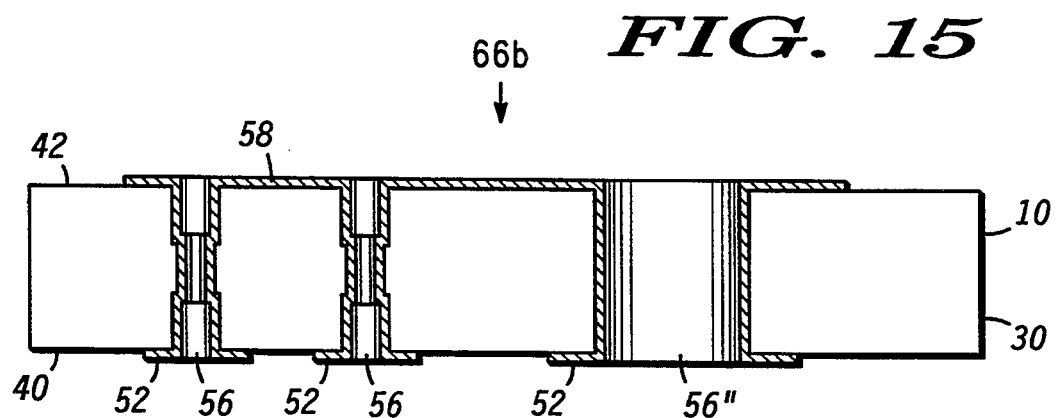
FIG. 16
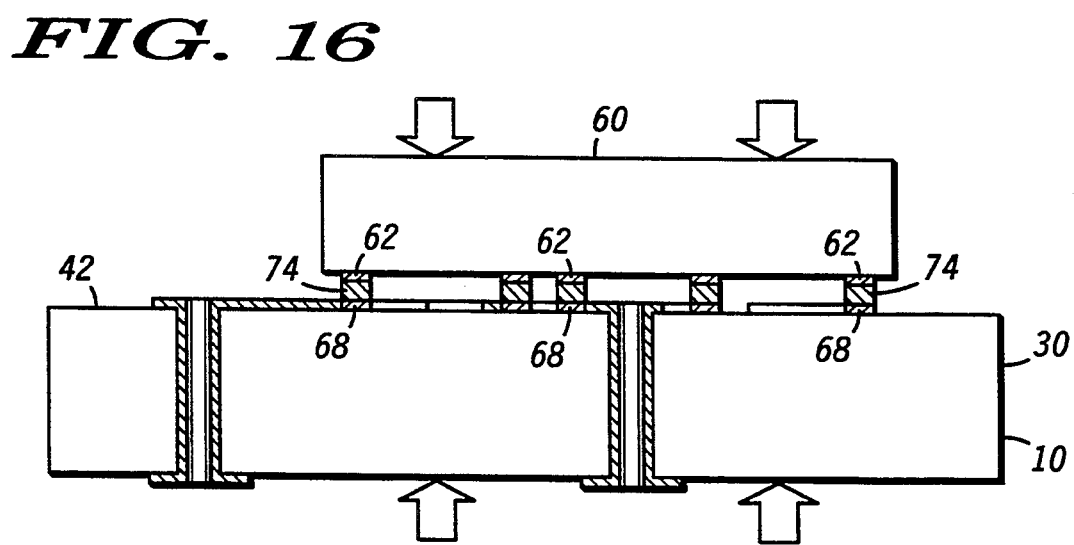

APPARATUS FOR ADAPTING SEMICONDUCTOR DIE PADS AND METHOD THEREFOR

TECHNICAL FIELD OF THE INVENTION

The present invention relates generally to chip carriers. More specifically, the present invention relates to chip carriers for adapting semiconductor bonding pads to printed circuit boards.

BACKGROUND OF THE INVENTION

Electrical circuit designers often face the problem of needing to implement electrical circuits using as little space as is practical. Circuit space is often a valuable asset which needs to be conserved, and the miniaturization of electrical circuits often improves speed, reduces noise, and leads to other performance advantages. The packages within which semiconductors are housed play a large role in determining the space needed for implementing an electrical circuit because larger packages require more space.

Traditionally, semiconductors have been housed in packages which consume an order of magnitude or more area than the actual semiconductor die which represents the electrical component. Traditionally, a bottom or inactive side of the die is bonded to a substrate and wire leads are bonded to metalized pads on a top or active side of the die. The wire leads then extend out beyond the boundary of the die for a considerable distance, where they are attached to a package lead or other contact. After the wire leads are installed, a cap is formed over the die, substrate, and wire leads to protect the component and wire leads from the environment. When an electrical circuit requires several semiconductor components, the circuit requires an amount of space dictated by the components' packages and interconnections between the packages.

"Flip chip" or direct chip attachment mounting techniques are used to increase the density of electrical circuits. Flip-chip mounting techniques relate to "flipping" the die over and directly attaching the active or top surface of the die to a printed wiring board. The attachment conventionally occurs through solder bumps formed on the metalized pads of the die. Since the actual semiconductor die size is so much smaller than a typical semiconductor package, tremendous improvements in electrical circuit space requirements can result.

However, conventional flip-chip techniques are highly impractical for all but a few applications. One problem associated with conventional flip-chip techniques is that direct attachment of a die to a printed wiring board provides little opportunity for relative movement between the die and the printed wiring board. Traditional printed wiring boards are made using a substrate, such as a Teflon-glass or a polyamide, which has a vastly different coefficient of thermal expansion (CTE) than the silicon from which most semiconductor dice are made. Consequently, when the electrical circuit experiences temperature changes, the printed wiring board expands at a different rate than the semiconductor die. A solder joint may break, the semiconductor die may break, or the semiconductor die electrical characteristics may change as a result of the stresses experienced. To overcome this problem, conventional flip-chip techniques have resorted to using exotic and expensive printed wiring board substrates or have limited themselves to applications which experience relatively constant temperatures.

Another problem associated with conventional flip-chip techniques is that the geometrical scale upon which semiconductor dice have been built for numerous years is not compatible with the geometric scale available for conventional printed wiring boards. For example, the metalized pads of a typical semiconductor die are exceedingly small and may be spaced very close together. Pad dimensions on the order of 4 mils by 4 mils with a spacing of as little as 1 mil between adjacent pads are representative of many conventional semiconductor dice. Such dimensions are compatible with conventional wire bonding techniques, but current conventional printed wiring board techniques do not permit the reliable printing of conductors, traces and other features at these small dimensions.

To overcome these problems, conventional flip-chip techniques have resorted to restricting flip-chip applications to only semiconductor components which are newly designed from scratch or which are redesigned from existing components to include die pads whose geometries are compatible with printed wiring board techniques. Costs increase only a little for new semiconductor designs. However, a gigantic infrastructure of old semiconductor designs has already been prepared and proven over the years, and these existing designs represent a wealth of intellectual effort which cannot simply be redesigned without the expenditure of tremendous amounts of funds. Consequently, flip-chip techniques are currently used in those few applications which incorporate only newly designed components or which have a sufficiently large volume to justify a component redesign.

Another problem associated with conventional flip-chip techniques is that of metallurgy incompatibilities between semiconductor dice and printed wiring boards. Semiconductor dice typically incorporate aluminum (Al) bonding pads, which are suitable for metal bonding purposes. Conventional printed wiring board techniques utilize tin-lead (SnPb) solder. If tin-lead solder is brought in contact with the aluminum pads of a semiconductor die, the pads will eventually dissolve in the solder, and electrical connection with the die will be lost. Consequently, conventional flip-chip techniques first insure that pad geometries of a semiconductor die are compatible with a printed wiring board, then deposit a barrier metal over the pads, followed by a copper (Cu) layer over the barrier metal and a layer of gold (Au) over the copper. Solder bumps may then be installed over the gold. The gold prevents the copper from oxidizing, and the solder attaches to the copper without a risk of dissolving the copper. The barrier metal protects the aluminum die pad from the copper and solder. A semiconductor foundry performs the additional metalization of semiconductor dice at the wafer level, putting flip-chip techniques beyond the reach of small run applications. The additional metallization requires masks which are compatible with the existing dice, and any original performance data gathered during manufacturing cannot be guaranteed after such significant changes to the semiconductor wafer.

Another problem associated with conventional flip-chip techniques is that of installing known good parts. Preferably, only known good parts should be installed on a printed wiring board to minimize scrap and rework. The semiconductor industry has learned how to efficiently test semiconductor dice at the wafer level through the use of test probes that contact the flat metalized pads of the dice. On the other hand, solder bumped semiconductor dice cannot be tested without using exotic and expensive test probes. Consequently, either great expense must be absorbed to acquire test probes that are compatible with solder bumps, or testing must be delayed until dice are installed on a printed wiring board. By delaying testing, the number of bad installed parts increases, and the costs associated with scrap and rework likewise increase.

SUMMARY OF THE INVENTION

Accordingly, it is an advantage of the present invention that an improved apparatus and method for adapting semiconductor die pads to a printed wiring board is provided.

Another advantage of the present invention is that an apparatus and method are provided which are compatible with existing semiconductor dice and testing facilities.

Another advantage of the present invention is that an apparatus and method are provided which are relatively inexpensive and may be adapted to small run applications.

Another advantage of the present invention is that an apparatus and method are provided which consume a minimal amount of space.

Another advantage of the present invention is that an apparatus and method are provided which do not require the use of wire bonding.

The above and other advantages of the present invention are carried out in one form by an apparatus for attachment to a semiconductor die. The die has a total of N bond-pads, where N is an integer number. The N bond-pads are positioned in a first pad constellation. The apparatus includes an insulating substrate having a first side and a second side. The apparatus includes N first conductive pads positioned substantially in the first predetermined pad constellation. The first pads reside on the first side of the substrate. "N" conductive vias are electrically coupled to corresponding ones of the first pads. The vias extend through the substrate between the first and second sides thereof. "N" second conductive pads are positioned in a second predetermined pad constellation. The second pad constellation substantially differs from the first constellation. The second pads are formed on the second side of the substrate, and the second pads are electrically coupled to corresponding ones of the vias.

The above and other advantages of the present invention are carried out in another form by an apparatus for adapting a semiconductor die to be installed on a printed wiring board. The apparatus includes an insulating substrate having a first side and a second side and having N holes between the first and second sides, where N is an integer number. First side metalization covers portions of the first side of said substrate. The first side metalization is formed substantially from gold.

Second side metalization covers portions of the second side of the substrate. The second side metalization is arranged into a pad constellation having N conductive pads. The N pads are coupled to corresponding ones of the N holes. The second side metalization is formed substantially from an alloy comprising gold and a metal from the platinum family. Via metalization resides within the holes. The via metalization is formed substantially from an alloy comprising gold and a metal from the platinum family near the second side of the substrate. The via metalization is formed substantially from gold near the first side of the substrate.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 1 shows a cross sectional side view of various layers of materials utilized in connection with a semiconductor die carrier after a first stage in the formation of the semiconductor die carrier;

FIG. 2 shows a top view of an exemplary array of semiconductor die carriers formed in accordance with the teaching of the present invention;

FIG. 3 shows a bottom view of an exemplary form of a single semiconductor die carrier from the array depicted in FIG. 2;

FIG. 14 shows a cross sectional side view of the die shown in FIG. 12;

FIG. 15 shows a cross sectional side view of the single carrier shown in FIGS. 3 and 13;

FIG. 16 shows a cross sectional side view of the carrier and die after an attachment stage;

Figure 4:
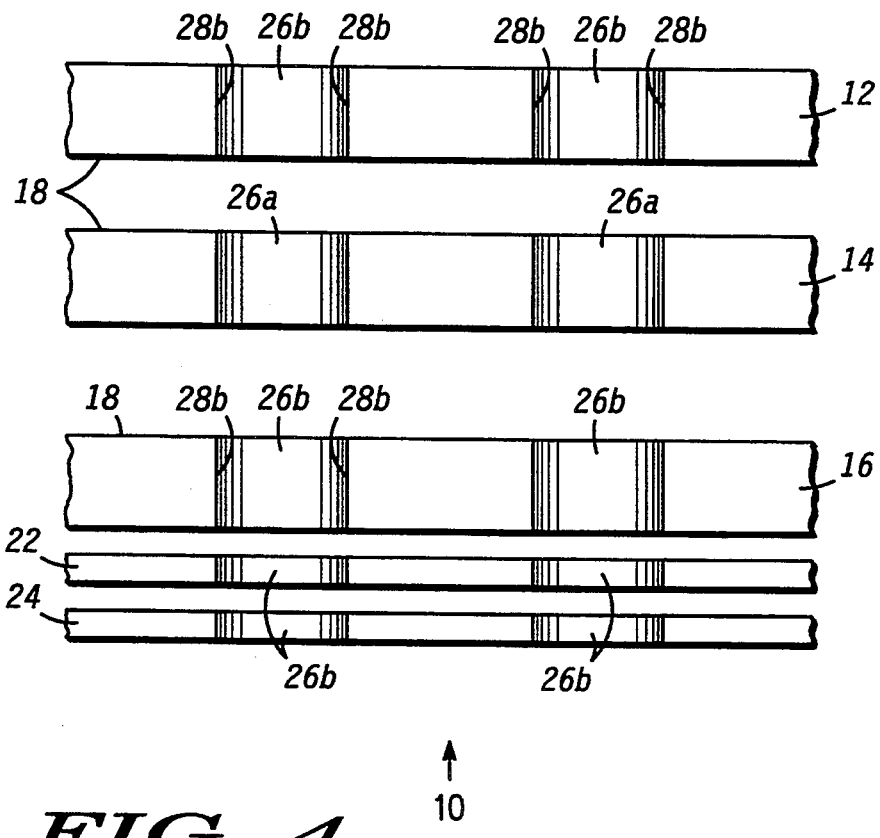
FIG. 4 shows a cross sectional side view of a portion of the various layers after a second stage.

In the following description of preferred embodiments, certain items are either similar to or mirror images of other items. This description distinguishes such items from their counterparts by the use of lower case alphabetic characters ("a", "b", and so on) which are appended to a common reference number. When an alphabetic character is omitted, the description refers to any one of such items and their counterparts individually or to all of them collectively.

DETAILED DESCRIPTION OF THE PREFERRED EMBODIMENTS

FIG. 1 depicts a first stage in a process for forming an array of semiconductor die carriers 10. FIG. 1 shows a cross sectional side view of sheets, or layers, 12, 14, and 16 of an insulting material 18. In subsequent stages, sheets 12, 14, and 16 are laminated together into an integral substrate for carriers 10. While the presently preferred embodiment of the present invention uses three sheets of material 18, nothing prevents the use of only two sheets or of more than three sheets. In the preferred embodiment, material 18 is a green, or unfired, ceramic material available in several different thicknesses and held together through organic binders (not shown).

For convenience, sheets 12, 14, and 16 have the same thickness, but nothing requires equal thicknesses. In the preferred embodiment, sheets 12, 14, and 16 each have a thickness of around four mils, so that the combined thickness of green sheets 12, 14, and 16 is around twelve mils. Generally speaking, the thicknesses of sheets 12, 14, and 16 are chosen so that the combined thickness is as thin as possible while still meeting strength goals with respect to the substrate upon which carriers 10 are built.

FIG. 2 shows an array 20 of carriers 10 that will eventually be formed together in a common processing batch in accordance with the processing stages described herein. Each of sheets 12, 14, and 16 is approximately the same size as the others and large enough to accommodate the entirety of array 20. In the preferred embodiment, array 20 is around two inches by two inches, but this size will vary from application to application. FIG. 3 shows a bottom view of an exemplary form of a single carrier 10 from array 20.

With reference back to FIG. 1, sheets 22 and 24 are made from a non-stick material, such as Mylar, relative to green ceramic 18. Sheets 22 and 24 are approximately the same size as sheets 12, 14, and 16. The first stage of the process is complete after green ceramic sheets 12, 14, and 16 and non-stick sheets 22 and 24 have been obtained.

FIG. 4 illustrates a second stage in the process of forming carrier 10. The second stage forms holes 26a in sheets 12 and 14, and forms holes 26b in sheets 16, 22, and 24. In the preferred embodiment, holes 26 are punched through sheets 12, 14, 16, 22, and 24 by a computerized punch. A common pattern is used in forming holes 26 in layers 12, 14, 16, 22, and 24.

As illustrated in FIG. 3, a single carrier 10 includes "N" holes 26, where N is the integer number sixteen for the exemplary carrier 10 depicted in FIG. 3. The number N has a one-to-one relationship with the number of die bond pads on a semiconductor die for which carrier 10 is intended. Of course, those skilled in the art will appreciate that the precise number of holes 26 included in each carrier 10 will depend on the number of die bond pads of a particular semiconductor die. The same spatial relationships which exist between holes 26 on one of sheets 12, 14, 16, 22, and 24 exists for each of sheets 12, 14, 16, 22, and 24. In fact, nothing prevents the punching of holes 26a through layers 12 and 14 in one operation and punching holes 26b through layers 16, 22, and 24 in another operation. Preferably, holes 26 for all of carriers 10 within array 20 (see FIG. 2) are punched in this second stage. Thousands of holes 26 may be punched for the entire array 20.

Holes 26 are dimensioned to achieve particular aspect ratio goals with respect to ceramic sheets 18. The aspect ratio for each of sheets, or layers, 12, 14, and 16 is calculated by dividing the thickness of the layer by the diameter of the layer's hole 26. Holes 26 are dimensioned so that an aspect ratio of less than approximately 1:1 is maintained for each of sheets 12, 14, and 16. Moreover, the diameters and cross sectional areas of holes 26a are larger than the corresponding diameters and cross sectional areas of holes 26b. In addition, holes 26 are dimensioned so that the aspect ratio of holes 26a with respect to the combined thicknesses of sheets 12, 14, and 16 is greater than 1:1.

As discussed above, strength requirements for the substrate upon which semiconductor die carrier 10 is formed dictate the thicknesses for sheets 12, 14, and 16. Thus, the diameters of holes 26a and 26b are chosen to achieve aspect ratio goals. By way of example, when each of green ceramic sheets 12, 14, and 16 is around four mils thick, holes 26a may desirably be around six mils in diameter and holes 26b may be around four mils in diameter. The resulting aspect ratios for layers 12 and 14 are each 4/6, or 0.667. The resulting aspect ratio for layer 16 is 4/4, or 1.000. The combined aspect ratio is 12/6, or 2.000.

By keeping the combined aspect ratio at greater than 1:1, the amount of area consumed on the surfaces of the substrate upon which carrier 10 is formed is reduced, and the overall area consumed by die carrier 10 may be reduced accordingly. By keeping the individual aspect ratios for each of sheets 12, 14, and 16 at 1:1 or less, complete and uniform coverage of metallization within vias may be achieved, as is discussed below.

The precise diameter of holes 26b through layers 22 and 24 is believed to be relatively unimportant, so long as such holes 26b have smaller diameters than holes 26a. Holes 26b through layers 22 and 24 are dimensioned equal to holes 26b through layer 16 for convenience.

Hole walls 28a surround holes 26a in sheets 12 and 14. Hole walls 28b surround holes 26b in sheet 16. The presently preferred embodiments of the present invention contemplate the use of holes 26 which have a circular cross sectional area. However, this particular geometry is not necessary, and square, elliptical, rectangular, and other cross sectional shapes will also work. Those skilled in the art will appreciate that when holes 26a or 26b are formed to exhibit such alternatively shaped cross sectional areas, aspect ratios cannot be defined with respect to a diameter. In these situations, a maximal distance between hole walls 28 may be used in place of the diameter to calculate aspect ratios. The maximal distance represents the maximum distance across a hole 26 between any opposing walls which make up hole walls 28 in a common hole 26. Thus, the maximal distance for a circle is its diameter, the maximal distance for a square is the length of one side of the square, and the maximal distance of a rectangle is the length of the longest side of the rectangle.

Figure 5:
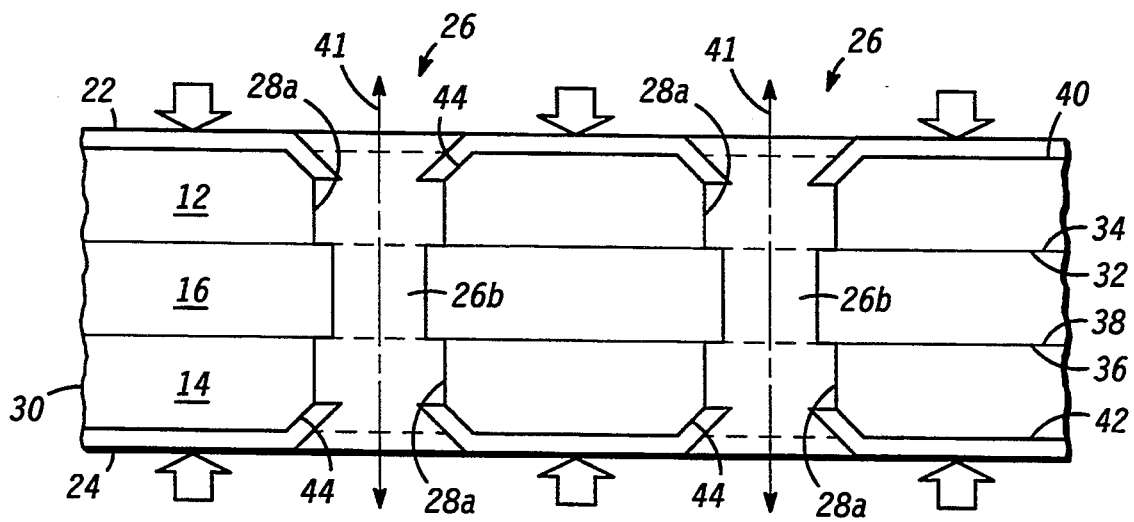
FIG. 5 shows a cross sectional side view of a portion of the various layers after a third stage.

FIG. 5 shows a cross sectional side view of a portion of array 20 after a third stage in the formation process. In this third stage, sheets 12, 14, and 16 are pressed or laminated together to form an integral substrate unit 30. Prior to pressing, sheets 12, 14, and 16 are juxtaposed so that a bottom side 32 of sheet 12 contacts a top side 34 of sheet 16 and a bottom side 36 of sheet 16 contacts a top side 38 of sheet 14. Non-stick sheets 22 and 24 are placed next to top and bottom sides 40 and 42, respectively, of sheets 12 and 14.

In addition, sheets 12, 14, 16, 22, and 24 are positioned so that holes 26 therein are substantially aligned across the entire hole pattern. When thousands of holes 26 are formed in each of sheets 12, 14, 16, 22, and 24 across array 20 (see FIG. 2), each hole 26 in one of sheets 12, 14, 16, 22, and 24 is substantially aligned with corresponding holes in the other ones of layers 12, 14, 16, 22, and 24. As a result of this alignment, the centers of corresponding holes 26 are generally positioned along common lines, such as dotted lines 41 shown in FIG. 5. Moreover, stepped openings result, wherein the central region of each opening, which is formed by hole 26b in layer 16, has a smaller cross sectional area and a smaller diameter than the exterior regions of the opening.

After the alignment, sheets 12, 14, 16, 22, and 24 are pressed together in a conventional press (not shown). Compression pressures of around 3000 psi, or any other pressure suitable for laminating material 18, may desirably by applied to sheets 12, 14, 16, 22, and 24. This pressure apparently causes non-stick sheets 22 and 24 in the vicinity of holes 26b therein to deform inward. Such inward deformation forms bevelled edges 44 in layers 12 and 14 where hole walls 28a therein intersect side 40 and side 42, respectively, of substrate 30. Those skilled in the art will appreciate that FIG. 5 shows the relative size of bevelled edges 44 in an exaggerated state for the purpose of clarity.

After the completion of the laminating stage depicted in FIG. 5, substrate 30 is removed from the press and sheets 22 and 24 are removed from substrate 30. Substrate 30 is then heated or fired in a kiln at a relatively low temperature. In particular, substrate 30 is first heated at a very low temperature to burn off organic binders within substrate 30. Then, the temperature is raised, and a curing temperature which is preferably less than 1200° C. and more preferably around 860° C. is maintained for a predetermined period of time. Thus, substrate 30 represents a low-temperature ceramic. The relatively low temperature firing is advantageous compared to firing at higher temperatures because less relative movement of holes 26 occurs as a result of shrinkage in material 18. The reduced movement of holes 26 leads to improved accuracy in the placement of holes 26. Those skilled in the art will appreciate that the hole dimensions and layer thickness which are discussed above shrink as a result of firing substrate 30. However, the same aspect ratio goals which are discussed above in connection with FIG. 4 are maintained after firing.

Figure 6:
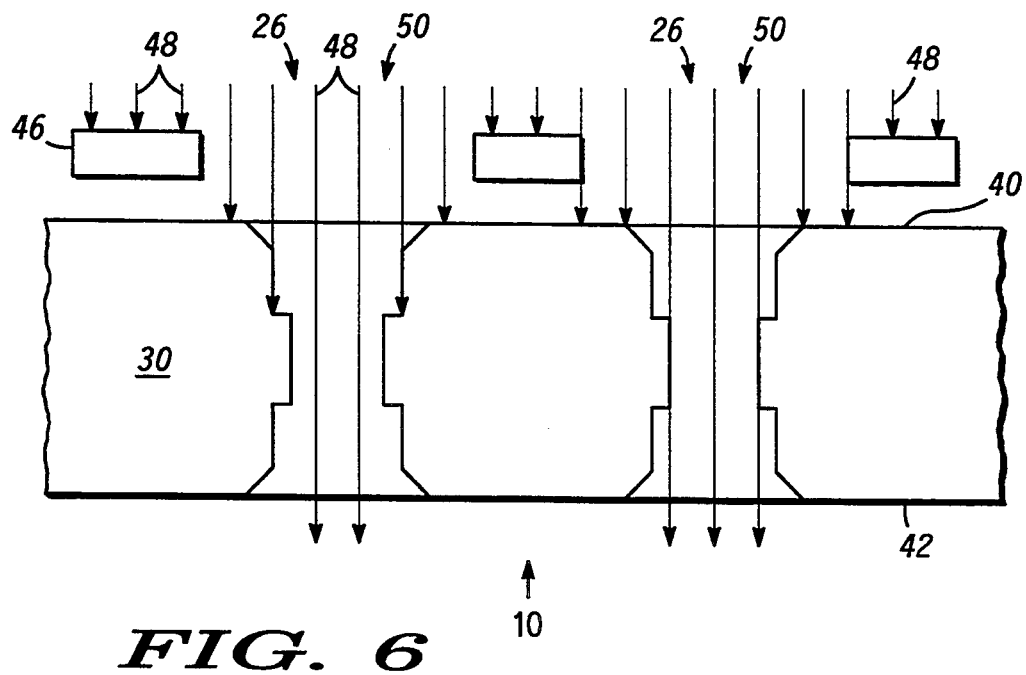
FIG. 6 shows a cross sectional side view of a portion of the semiconductor die carrier at a fourth stage.

FIG. 6 shows a cross sectional side view of a portion of array 20 at a fourth stage in the formation process. In this fourth stage, a conductive material is applied to substrate 30 from side 40 thereof. An alloy made from gold (Au) and a metal from the platinum family, such as platinum (Pt) or palladium (Pd) is used in this fourth stage in the preferred embodiment. Other adhesive conductive materials well known in the art may also be employed depending upon the users requirements. This alloy is advantageous because it is compatible with both conventional tin-lead (SnPb) solder and with substantially pure gold (Au).

The present invention contemplates using conventional metallization processes during this fourth stage. However, the above discussed alloy may not be applied by conventional evaporation or sputtering techniques because a uniform mixture of the platinum family and gold metals is difficult to obtain. Therefore, a conventional thick film screening process is preferred for the application of metallization in this fourth stage. Accordingly, a screen mask 46 is aligned over side 40 of substrate 30, and a metallic paste 48 carrying the alloy is forced through open areas 50 in mask 46.

With reference back to FIG. 3, mask 46 defines the pattern shown therein. Open areas 50 in mask 46 define a pad constellation 51 having N pads 53, where N is the integer number discussed above that has a one-to-one relationship with the number of bond-pads on an intended semiconductor die. Each pad 53 has at least two functions. First, pads 53 in pad constellation 51 mate with a conventional printed wiring board in a manner discussed below. Second, each of pads 53 electrically couples to a via or feedthrough formed through a corresponding one of holes 26 in substrate 30.

Preferably, carrier 10 is as small as possible to minimize circuit space requirements. Accordingly, the size of pads 53, the pitch between pads 53, the particular pattern exhibited by pad constellation 51, and the location and diameter of holes 26 are preferably all mutually configured to occupy as small of an area as possible while still meeting layout rules for a particular printed wiring board upon which carrier 10 may be installed. In other words, it is the layout rules of a printed wiring board upon which carrier 10 is to be used that dictates the geometry of pad constellation 51, and pad constellation 51 will substantially differ from a pad constellation (discussed below) associated with the semiconductor die for which carrier 10 is intended. Generally speaking, these layout rules will often dictate that carrier 10 be larger than the semiconductor die for which it is intended in order to accommodate layout rules being used for the formation of printed wiring boards.

With reference back to FIG. 6, mask 46 is desirably aligned on holes 26 in substrate 30. Since substrate 30 has already been fired, alignment errors associated with hole movement during firing are substantially eliminated. In one embodiment, mask 46 is aligned on holes 26 within a single sector 52 (see FIG. 2) of array 20. After use of the mask in this sector 52, mask 46, or a different appropriate mask, is moved to other sectors of array 20 and the alignment and metallization process repeated. By aligning mask 46 to different individual sectors 52 of array 20, alignment errors caused by hole movement over the entirety of array 20 are reduced.

With reference back to FIG. 6, paste 48 coats substrate 30 only under open areas 50 of mask 46. As discussed above, mask 46 is constructed so that open areas 50 overlie holes 26, surrounding "land" sections of side 40 of substrate 30, and pads 53 (see FIG. 3). This fourth stage additionally contemplates that substrate 30 and paste 48 may again be fired, at a temperature at or less than the firing temperature for substrate 30, to adhere the alloy to substrate 30.

Figure 7:
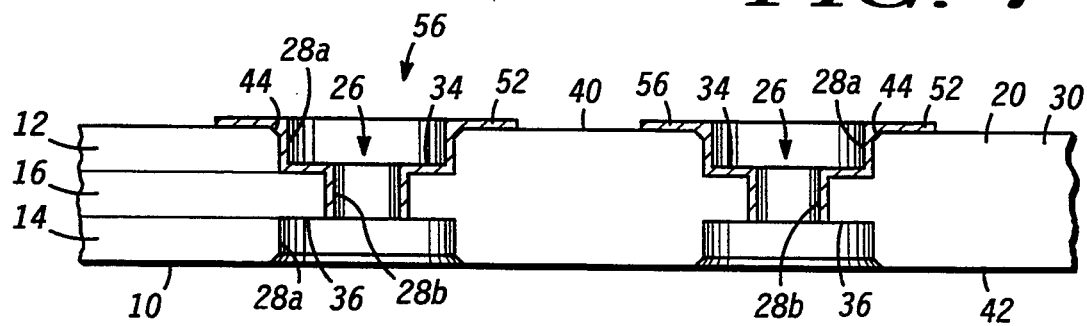
FIG. 7 shows a cross sectional side view of a portion of the semiconductor die carrier after the fourth stage.
Figure 8:
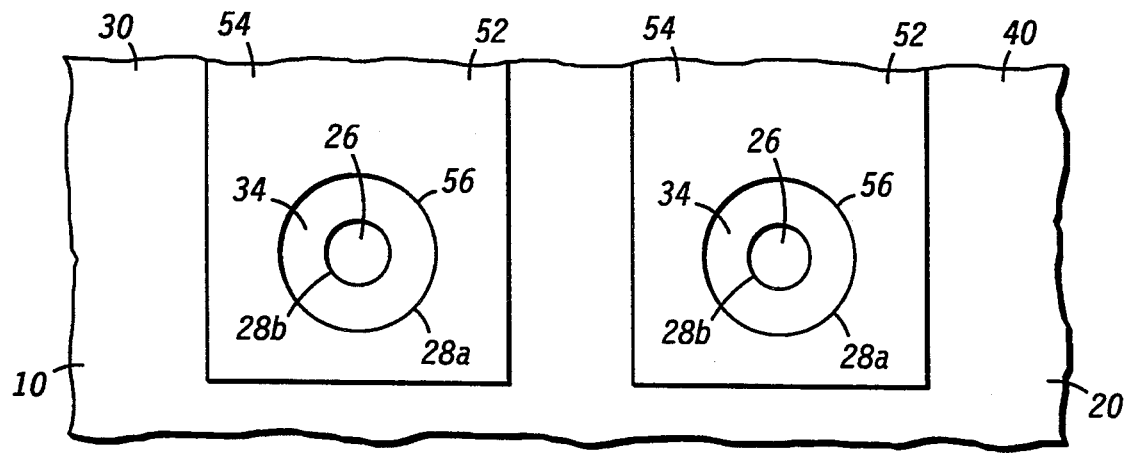
FIG. 8 shows a partial top view of the semiconductor die carrier after the fourth stage.

FIG. 7 shows a partial cross sectional side view of a portion of a carrier 10 from array 20 after this fourth stage in the formation process. FIG. 8 shows a partial top view after this fourth stage in the formation of carriers 10.

With reference to FIGS. 7 and 8, a coating 52 of the above-discussed conductive alloy overlies the portions of side 40 of substrate 30 which surround holes 26 and forms pads 51 (see FIG. 3). Coating 52 remains on substrate 30 after firing paste 48 (see FIG. 6). In addition, coating 52 extends into hole 26 through layers 12 and 16 of substrate 30. Specifically, coating 52 overlies hole walls 28a of layer 12 and hole walls 28b of layer 16. Coating 52 also overlies the portions of side 34 which surround holes 26b of layer 16 and which are exposed through holes 26a. Due to bevelled edges 44, no thinning of coating 52 occurs at the intersection of hole walls 28a and side 40, and a good electrical contact is made between a trace 54 formed from coating 52 on side 40 of substrate 30 and a via 56 partially formed on hole walls 28a from coating 52. Due to the individual aspect ratios for layers 12 and 16, discussed above, uniform coverage exists on hole walls 28a and 28b through layers 12 and 16, respectively.

While a certain amount of back-scattering may place some of coating 52 on hole walls 28a of layer 14 and on side 36 of layer 16, the present invention requires no particular coverage to occur. Thus, coating 52 need not extend further than layer 16 after the fourth stage.

Figure 9:
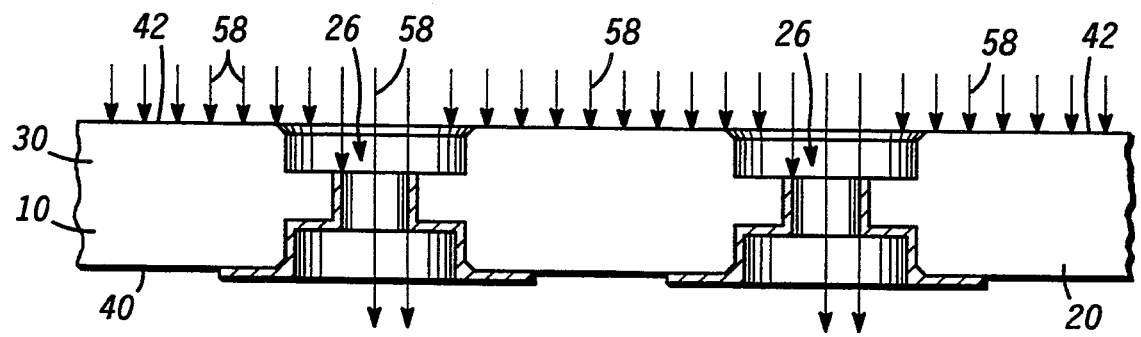
FIG. 9 shows a cross sectional side view of a portion of the semiconductor die carrier at a fifth stage.

FIG. 9 shows a cross sectional side view of a portion of a carrier 10 from array 20 at a fifth stage in the formation process. During this fifth stage, a conductive material 58 is applied to substrate 30 from side 42 thereof. FIG. 9 depicts side 42 facing upward, rather than side 40 as was depicted facing upward in FIGS. 6-8.

In the preferred embodiment, conductive material 58 is made substantially from gold (Au) rather than the alloy discussed above. Gold is desirable due to its compatibility with the above-discussed platinum family/gold alloy, and its high melting point compared to tin-lead (SnPb) solder. In this embodiment, gold is screen-applied to a thickness of around seven microns over the entirety of side 42 of substrate 30. However, those skilled in the art will appreciate that other metallization processes, such as evaporation or sputter deposition, perhaps in combination with a plating process, may be utilized as well. This metallization stage causes conductive material 58 to enter hole 26 from side 42 and coat hole walls 26a of layer 14, side 36 of layer 16, and hole walls 26b of layer 16. After application of metallization, array 20 of carriers 10 is again fired at a temperature at or less than the firing temperature for substrate 30 to harden and firmly affix material 58 to substrate 30.

Figure 10:
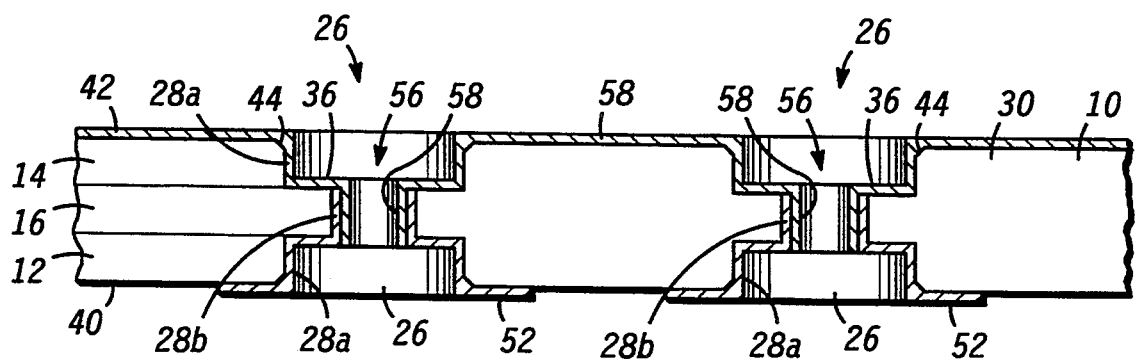
FIG. 10 shows a cross sectional side view of a portion of the semiconductor die carrier after the fifth stage.

FIG. 10 shows a cross sectional side view of a portion of a carrier 10 of array 20 after the fifth stage in the formation process. Conductive coating 58 overlies the entirety of side 42 of substrate 30. FIG. 10 also depicts side 42 of substrate 30 facing upward. Coating 58 extends into hole 26 through layers 14 and 16 of substrate 30. In particular, coating 58 overlies hole walls 28a of layer 14 and hole walls 28b of layer 16. At hole walls 28b, coating 58 also overlies coating 52 applied in the above-discussed fourth stage. Thus, a double metallization coating occurs in the center of the barrels of vias 56 to insure that no thinning occurs. Coating 58 also overlies the portions of side 36 of layer 16 which surround holes 26b of layer 16 and which are exposed through holes 26a in layer 14. Due to bevelled edges 44, no thinning of coating 58 occurs at the intersection of hole walls 28a and side 42 of substrate 30, and a good electrical contact is made between coating 58 on side 42 and coating 58 in via 56. Due to the individual aspect ratios for layers 14 and 16, discussed above, uniform coverage exists on hole walls 28a and 28b through layers 14 and 16, respectively.

At this point in the construction of carriers 10, pad constellations 51 have been formed (see FIG. 3) on side 40 of substrate 30, and vias 56 have been formed through substrate 30. Side 42 of substrate 30 has been entirely metallized, but no pattern has been formed therein. Within vias 56, an alloy of gold and a metal from the platinum family resides near side 40 of substrate 30 and a conductive material made substantially from gold resides near side 42 of substrate 30. In the very center of vias 56, a layer of the alloy and a layer of gold adhere to hole walls 26b.

Vias 56 may now be visually inspected. Conductive coatings on hole walls 28a in layers 12 and 16 are easily viewed because they reside near the exterior surfaces of substrate 30. Likewise, conductive coatings on sides 34 and 36, respectively, of layer 16 are easily viewed because they extend perpendicular to direct viewing angles. Conductive coatings on hole walls 28b in the center of vias 56 are also easily viewed. They may be easily viewed because they extend for only a short distance and because viewing angles are enlarged due to wider holes 26a located on either side of holes 26b.

Figure 11:
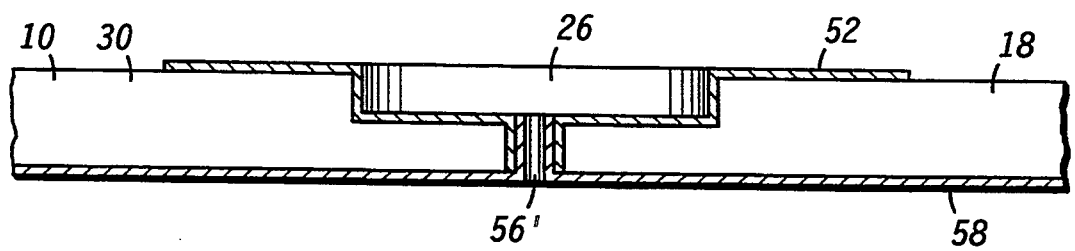
FIG. 11 shows a partial cross sectional side view of an alternate embodiment of the semiconductor die carrier.

While the above discussed embodiments of the present invention have shown substrate 30 as having three distinct layers, other adaptations of stepped vias 56 may be devised as well. For example, FIG. 11 illustrates a substrate 30 with a stepped via 56' that is constructed through this fifth stage in the formation process in substantially the same manner as described above, except that only two layers of material 18 are used. The aspect ratios of holes in each individual layer is desirably less than 1:1, but the combined aspect ratio at holes through at least one of the two layers is greater than 1:1.

At this point in the formation process, the only consideration given to the intended semiconductor dice is in the number N of pads 53 included in pad constellations 51 (see FIG. 3). Thus, the formation process may be conducted up to this point for semiconductor dice having particular numbers of bond-pads without consideration given to particular layout features of bond-pads on particular semiconductor dice. In other words, arrays 20 may be completed through this fifth stage in the formation process ahead of time, then held in inventory and quickly adapted to intended semiconductor dice as needed. This adaptation is discussed below in connection with FIGS. 12-19.

Figure 12:
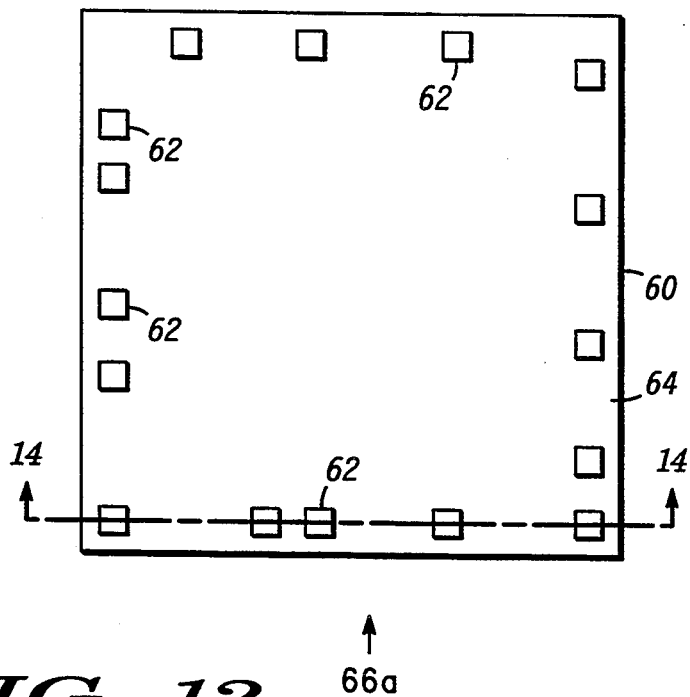
FIG. 12 shows a top view of a typical semiconductor die.

FIG. 12 shows a top view of a representative semiconductor die 60. Those skilled in the art will appreciate that die 60 is a representation of a wide variety of different semiconductor die, and that the teaching of the present invention is applicable to any semiconductor die, whether configured as illustrated in FIG. 12 or not. Die 60 has N bond pads 62 positioned on a top surface 64 thereof, typically distributed near the perimeter of die 60. Typically, bond pads 62 are configured geometrically and metallurgically for wire lead bonding. Bond pads 62 are configured in a pad constellation 66a that differs from one type of die 60 to another. The size, pitch, and relative locations of the N bond pads 62 define pad constellation 66a. As discussed above, these features of pad constellation 66a are typically too small in existing semiconductor die designs for reliable printing on a conventional printed wiring board. In other words, a mate to pad constellation 66a cannot practicably be formed in a conventional printed wiring board.

However, conventional photo-lithographic techniques may be employed to form a mating pad constellation to pad constellation 66a in coating 58 on side 42 of ceramic substrate 30 of carrier 10 (see FIG. 10). Due to the relatively small size of carrier 10 compared to typical printed wiring boards, the material costs of carrier 10 are very low.

Figure 13:
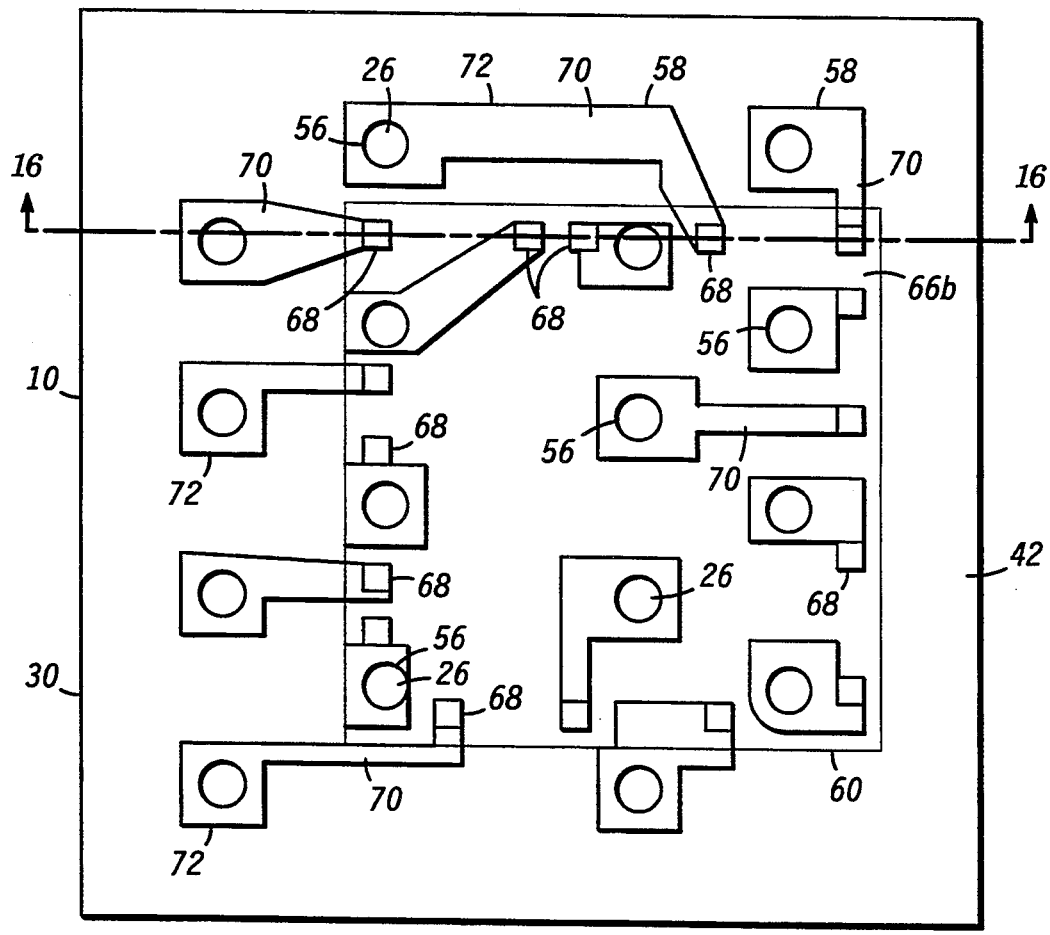
FIG. 13 shows a top view of the single carrier depicted in FIG. 3 with an outline of the die shown in FIG. 12 superimposed thereon.

FIG. 13 shows a top view of a single carrier 10 with an outline of die 60 in a "flipped" orientation superimposed thereon. In this flipped orientation, top surface 64 of die 60 faces downward. As shown in FIG. 13, a pad constellation 66b having N conductive pads 68 configured to mate with the N bond pads 62 of pad constellation 66a (see FIG. 12) of die 60 has been formed on side 42 of substrate 30. Since pad constellation 66b mates with die 60, not a printed circuit board, it is smaller than pad constellation 51 formed on side 40 of substrate 30 and discussed above in connection with FIG. 3. In addition, N conductive traces 70 have been formed to electrically couple the N pads 68 to corresponding ones of the N conductive vias 56 formed at the N holes 26.

Die 60 need not be located at any particular position on carrier 10. Thus, die 60 may be offset from the precise center of carrier 10, as illustrated in FIG. 13, so that bond pads 62 of pad constellation 66a (see FIG. 12) do not overlie any hole 26. After defining a position for die 60 relative to carrier 10, a mask (not shown) may be prepared to define pads 68, traces 70, and land areas 72 surrounding holes 26. A conventional photoresist may be applied to side 42, and the mask then aligned to holes 26. As discussed above, the mask may be aligned to only one portion of array 20 (see FIG. 2) at a time to improve alignment of the mask with holes 26. The photoresist may then be exposed through the mask, and the unwanted portions of the conductive material under the exposed photoresist removed by etching. Those skilled in the art will appreciate that gold is highly etchable from a ceramic substrate using conventional photolithographic processes and etchants. Thus, fine details may readily be achieved, and pads 68 having sizes and pitches of only a few mils may be reliably detailed.

FIG. 14 shows a cross sectional side view of die 60 in the flipped orientation. FIG. 14 depicts conductive bumps 74 which are formed on each of bond pads 62 of pad constellation 66a. In the preferred embodiment, conductive bumps 74 are formed from an alloy made from gold and a metal from the platinum family. As discussed above, this alloy is compatible with the gold from which layer 58 (see FIG. 13) is made. Conductive bumps 74 may desirably extend away from pads 62 for a distance in the three to five mil range.

FIG. 15 shows a cross sectional side view of a single carrier 10 from array 20 (see FIG. 2). At the stage depicted in FIG. 15, coating 58 has been etched to form pads 68 of pad constellation 66b, traces 70, and land areas 72 (see FIG. 13). For clarity, FIG. 15 omits metallization from the interior of vias 56. Vias 56 are preferably formed as stepped vias, as discussed above, to reduce the area on the surfaces of carrier 10 that is dedicated to vias. However, nothing prevents the use of one or more conventional straight-walled vias 56" if desired.

FIG. 16 shows a cross sectional side view of a single carrier 10 and die 60 after an attachment stage. Preferably, conductive bumps 74 are welded to pads 68 by the use of a conventional thermal compression process which slightly raises temperatures while applying compression pressures preferably around 100 psi. This couples the N bond pads 62 of die 60 to the N pads 68 of carrier 10. In the preferred embodiment, die 60 is compressed with carrier 10 so that around a one mil gap remains between die 60 and carrier 10. The use of gold as conductive coating 58 on surface 42 of carrier 10 and the use of the above-discussed alloy for conductive bumps 74 results in a relatively high temperature joint, wherein melting should not occur below 300° C. Preferably, any number of dice 60 are attached to carriers 10 within array 20 (see FIG. 2) during this stage.

Figure 17:
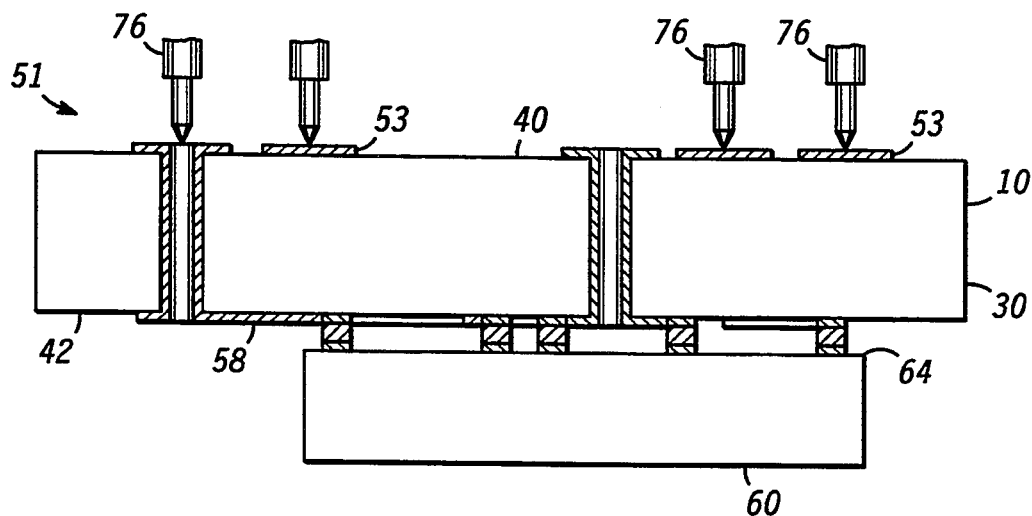
FIG. 17 shows a cross sectional side view of the carrier and die after a testing stage.

FIG. 17 shows a cross sectional side view of a single carrier 10 and die 60 after a testing stage. Once dice 60 have been attached to carriers 10 in array 20, as discussed above in connection with FIG. 16, the resulting assembly may be tested using conventional testing equipment. In particular, the assembly may be turned over so that test probes 76 can contact pads 53 on side 40 of each carrier 10. Through probes 76, each die 60 may be operated. An underfill (not shown) may be used between die 60 and carrier 10 to improve heat transfer and/or a sealant (not shown) may be applied around the perimeter of die 60 to protect surface 64 of die 60 from the environment. Thus, operational, burn-in, temperature, and other tests may be performed. Moreover, the operation of each die 60 desirably occurs while die 60 and other similar dice 60 are attached to array 20 (see FIG. 2). Thus, dice 60 are positioned in a regular pattern and problems with handling small dice 60 and associated carriers 10 are reduced. Since pads 53 on surface 40 of carrier 10 have flat surfaces, conventional and relatively inexpensive probes 76 may be used in this testing stage. By performing testing at this stage in the manufacturing process, known good parts may be identified for installation on a printed wiring board in a subsequent stage, discussed below.

Figure 18:
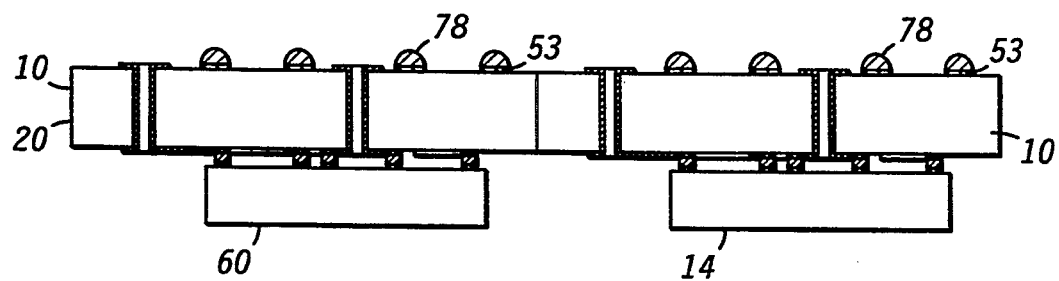
FIG. 18 shows a cross sectional side view of a portion of the array of carriers and dice installed thereon after a solder bumping stage.

FIG. 18 shows a cross sectional side view of a portion of array 20 of carriers 10 and dice 60 installed thereon after a solder bumping stage. After testing of dice 60 and carriers 10 has been completed, conductive solder bumps 78 may be formed on pads 53 of carriers 10. Bumps 78 are preferably formed from a conventional tin-lead (SnPb) solder. Since pads 53 are made from the above-discussed alloy of gold and a metal from the platinum family, compatibility with solder is maintained and pads 53 will not dissolve in the solder. Bumps 78 are applied over any number of carriers 10 included in array 20.

Once solder bumps 78 have been formed on pads 53 of carriers 10, carriers 10 are separated from array 20 into individual components. Conventional semiconductor sawing processes are preferably used to break individual carriers 10, each having a die 60 attached thereto, from array 20.

Figure 19:
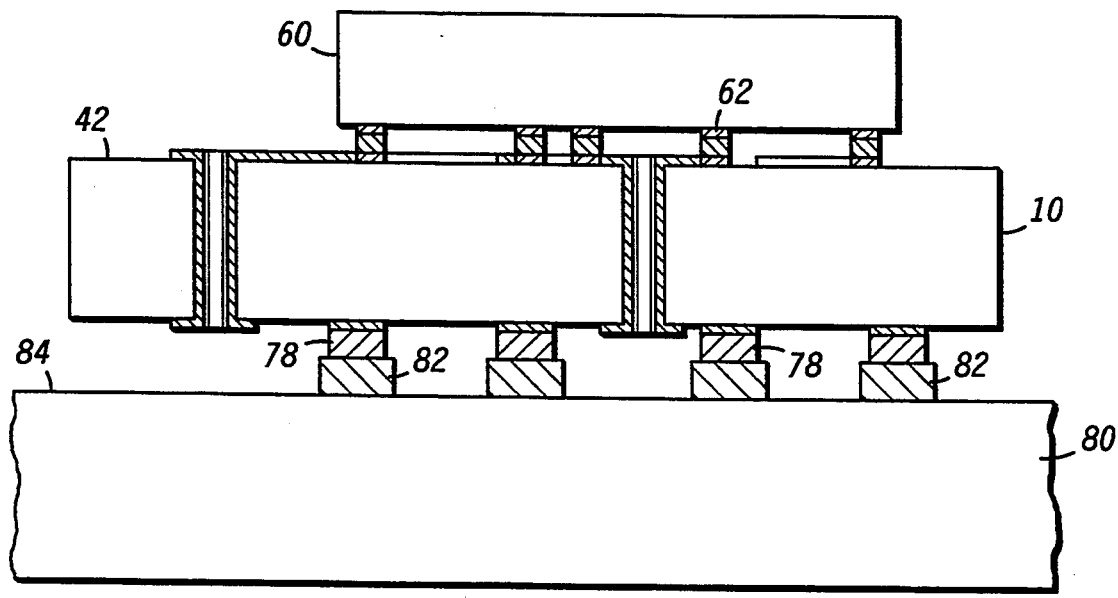
FIG. 19 shows a cross sectional side view of a single carrier and die installed on a printed wiring board.

FIG. 19 shows a cross sectional side view of a single carrier 10 and die 60 installed on a printed wiring board 80. Printed wiring board 80 is constructed using conventional techniques. Conductive pads 82 are formed on a surface 84 of board 80 in a conventional manner. In other words, pads 82 may be formed by screen printing, etching, or the like. Moreover, pads 82 are configured to mate with various ones of pads 53 from pad constellation 51 (see FIG. 3). Of course, other conductive traces may also be formed to interconnect pads 53 of carrier 10 to other components or to connectors (not shown).

When printed wiring board 80 has been formed, carrier 10, with die 60 attached thereto, is attached to board 80. A conventional fellow solder process achieves the attachment. The reflow solder process melts solder bumps 78 causing bumps 78 to adhere to pads 82 of board 80 and causing pads 82 to electrically couple to pads 62 of die 60 through carrier 10. The melting of solder occurs at a relatively low temperature, typically around 187° C., compared to the gold - gold alloy junctions formed on side 42 of carrier 10. Thus, during the attachment of carrier 10 to board 80, connections between die 60 and carrier 10 are not degraded.

In summary, the present invention provides an improved apparatus and method for adapting semiconductor bond pads to a printed wiring board. The semiconductor die's bond pads are redistributed geometrically and metallurgically for compatibility with conventional printed wiring boards. Moreover, the carrier of the present invention is constructed from a ceramic material which has a coefficient of thermal expansion between silicon and conventional printed wiring board materials. This ceramic material provides a cushion between the vastly different expansion rates and allows flip-chip attachment of semiconductor dice to conventional printed wiring boards and operation through a wide temperature range.

The carriers of the present invention are compatible with existing semiconductor dice and testing facilities. Dice may be installed on carriers and then operated to identify known good parts using conventional and relatively inexpensive probes that contact flat conductive pads. The adaptation apparatus and method of the present invention are relatively inexpensive and may be quickly adapted to small run applications. Existing semiconductor dice may be used, and entire wafers of semiconductor dice need not be reworked to add solder bumps.

The adaptation apparatus and method of the present invention consume a minimal amount of electrical circuit space. Carriers are typically no larger than they need to be to accommodate printed wiring board layout rules for the number of pads being coupled thereto from a semiconductor die. In addition, stepped vias may be formed through the carriers to minimize the amount of area needed by the carriers to accommodate vias.

Moreover, the present invention does not require the use of wire bonding. Thus, the advantages of flip-chip attachment are achieved without degrading area savings by running wire leads laterally away from a semiconductor die.

Further, while the means and method of the present invention have been described, for convenience of explanation, in terms of ceramic materials for layers 12, 14, 16, those of skill in the art will understand based on the description herein that other insulating materials (e.g. plastic impregnated materials, glasses, etc.) may also be used and bonded together using methods available for such materials.

The present invention has been described above with reference to preferred embodiments. However, those skilled in the art will recognize that changes and modifications may be made in these preferred embodiments without departing from the scope of the present invention. For example, those skilled in the art can devise alternate substrate materials and conductive coatings which are suitable for particular applications. These and other changes and modifications which are obvious to those skilled in the art are intended to be included within the scope of the present invention.

What is claimed is:

1. An apparatus for attachment to a semiconductor die having N bond-pads, where N is an integer number, comprising:
   an insulating substrate having opposed first and second sides and N holes extending there between, wherein portions of said substrate protrude into said holes in central regions thereof, so that said central regions of said holes have smaller diameters than regions of said holes adjacent said first and second surfaces;
   N first conductive pads positioned substantially in a first predetermined pad constellation wherein said N first pads of the constellation correspond in location with said N bond-pads of the semiconductor die, said first pads residing on said first side of said substrate;
   N electrically conductive regions electrically coupled to corresponding ones of said first pads, said electrically conductive regions extending through said holes in said substrate between said first and second sides, and substantially conformally covering said portions of said substrate which protrude into said holes; and
   N second conductive pads positioned in a second predetermined pad constellation different from said first pad constellation, said second pads being formed on said second side of said substrate and electrically coupled to corresponding ones of said electrically conductive regions; and,
   wherein said electrically conductive regions are formed of metal, a first portion of said metal having a first composition extending from said first surface into said holes and onto said protrusions and a second portion of said metal having a second composition different than said first composition extending into said holes from said second surface and onto said protrusions.

2. An apparatus for attachment to a semiconductor die as claimed in claim 1 wherein said first and second portions of said metal overlap on said protrusions.

3. An apparatus for attachment to a semiconductor die as claimed in claim 1 wherein one of said first and second portions consists essentially of gold and the other of said first and second portions consists essentially of gold and a platinum family metal.

4. An apparatus for attachment to a semiconductor die as claimed in claim 1 wherein said first pads comprise gold without a platinum family metal at least in locations corresponding to the N bond-pads and said second pads comprise gold with a platinum family metal.

5. An apparatus for attachment to a semiconductor die as claimed in claim 1 wherein said substrate is beveled where said holes meet said first and second surfaces.

6. An apparatus for adapting a semiconductor die to be installed on a printed wiring board, said apparatus comprising:
   an insulating substrate having a first side and a second side and having N holes between said first and second sides, where N is an integer number, and wherein said holes have a cross-section in a plane substantially parallel to said first or second side which is larger adjacent said first and second sides and smaller in a central region of said holes approximately mid-way between said first and second sides;
   first side metalization covering portions said first side of said substrate, said first side metalization being formed substantially from a first metal;
   second side metalization covering portions of said second side of said substrate, said second side metalization being arranged into a pad constellation having N conductive pads, said N pads being coupled to corresponding ones of said N holes, and said second side metalization being formed substantially from a second metal of different con, position than the first metal; and
   via metalization residing within said holes, said via metalization being formed substantially from said second metal proximate said second side of said substrate, and said via metalization being formed substantially from said first metal proximate said first side of said substrate, and said via metalization being formed of a combination of said first and second metals in said central regions of said holes.

7. An apparatus for adapting a semiconductor die to be installed on a printed wiring board as claimed in claim 6 wherein said combination comprises a layered combination wherein one metal overlies the other metal.

8. An apparatus for adapting a semiconductor die to be installed on a printed wiring board as claimed in claim 6 wherein said holes are tapered adjacent said first and second sides.

9. The apparatus of claim 6 wherein said first metal comprises gold substantially without metals from the platinum family and said second metal comprises gold with a metal from the platinum family.

* * * * *

UNITED STATES PATENT AND TRADEMARK OFFICE
CERTIFICATE OF CORRECTION

PATENT NO. : 5,342,999
DATED : August 30, 1994
INVENTOR(S) : John Kasper Frei et al.

It is certified that error appears in the above-indentified patent and that said Letters Patent is hereby corrected as shown below:

In column 14, claim 6, line 58, change the words "con, position" to --composition--.

Signed and Sealed this

Twenty-fourth Day of January, 1995

Attest:

BRUCE LEHMAN

Attesting Officer  *Commissioner of Patents and Trademarks*